(12) United States Patent
Koerner et al.

(10) Patent No.: US 10,672,678 B2
(45) Date of Patent: Jun. 2, 2020

(54) METHOD FOR FORMING A CHIP PACKAGE WITH COMPOUNDS TO IMPROVE THE DURABILITY AND PERFORMANCE OF METAL CONTACT STRUCTURES IN THE CHIP PACKAGE

(71) Applicant: INFINEON TECHNOLOGIES AG, Neubiberg (DE)

(72) Inventors: Heinrich Koerner, Bruckmuehl (DE); Michael Bauer, Nittendorf (DE); Reimund Engl, Munich (DE); Michael Huettinger, Munich (DE); Werner Kanert, Holzkirchen (DE); Joachim Mahler, Regensburg (DE); Brigitte Ruehle, Holzkirchen (DE)

(73) Assignee: INFINEON TECHNOLOGIES AG, Neubiberg (DE)

( * ) Notice: Subject to any disclaimer, the term of this patent is extended or adjusted under 35 U.S.C. 154(b) by 0 days.

(21) Appl. No.: 16/431,808

(22) Filed: Jun. 5, 2019

(65) Prior Publication Data

US 2019/0287875 A1    Sep. 19, 2019

Related U.S. Application Data

(63) Continuation-in-part of application No. 15/600,843, filed on May 22, 2017, now Pat. No. 10,497,634.

(30) Foreign Application Priority Data

May 20, 2016  (DE) .................. 10 2016 109 352

(51) Int. Cl.
*H01L 23/31* (2006.01)
*H01L 23/495* (2006.01)
*H01L 21/56* (2006.01)

(52) U.S. Cl.
CPC .......... *H01L 23/3142* (2013.01); *H01L 21/56* (2013.01); *H01L 23/49582* (2013.01)

(58) Field of Classification Search
CPC ....... H01L 23/29; H01L 21/56; H01L 23/532; H01L 23/00; H01L 23/495; H01L 23/293;
(Continued)

(56) References Cited

U.S. PATENT DOCUMENTS 7,301,175 B2 * 11/2007 Izuno ................ H01L 21/76251
257/100
9,305,869 B1 *  4/2016 Zhang ............... H01L 23/49551
(Continued)

*Primary Examiner* — Alexander O Williams
(74) *Attorney, Agent, or Firm* — Viering, Jentschura & Partner MBB

(57) ABSTRACT

In various embodiments, methods for forming a chip package are provided. The chip package may include a chip comprising a chip metal surface, a metal contact structure electrically contacting the chip metal surface, a packaging material at least partially encapsulating the chip and the metal contact structure, and a chemical compound physically contacting the packaging material and at least one of the chip metal surface and the metal contact structure, wherein the chemical compound may be configured to improve an adhesion between the metal contact structure and the packaging material and/or between the chip metal surface and the packaging material, as compared with an adhesion in an arrangement without the chemical compound, wherein the chemical compound is essentially free from functional groups comprising sulfur, selenium or tellurium.

20 Claims, 5 Drawing Sheets

(58) Field of Classification Search
CPC ............... H01L 24/48; H01L 23/53228; H01L 2924/01029; H01L 2924/186; H01L 2924/365; H01L 23/31; H01L 23/3142; H01L 23/49582
USPC .................................................. 257/676, 734
See application file for complete search history.

(56) References Cited

U.S. PATENT DOCUMENTS

| | | | |
|---|---|---|---|
| 9,780,069 B2* | 10/2017 | Haga | H01L 21/56 |
| 2009/0243065 A1* | 10/2009 | Sugino | H01L 23/16 |
| | | | 257/686 |
| 2011/0226513 A1* | 9/2011 | Chuma | H01L 23/49816 |
| | | | 174/254 |
| 2013/0076458 A1* | 3/2013 | Katou | C08F 2/48 |
| | | | 333/195 |
| 2013/0127332 A1* | 5/2013 | Chen | C09K 11/025 |
| | | | 313/503 |
| 2014/0353706 A1* | 12/2014 | Higashiuchi | C23F 11/182 |
| | | | 257/98 |
| 2015/0353740 A1* | 12/2015 | Kojima | F21V 19/001 |
| | | | 362/296.04 |
| 2017/0338165 A1* | 11/2017 | Koerner | H01L 23/495 |

\* cited by examiner

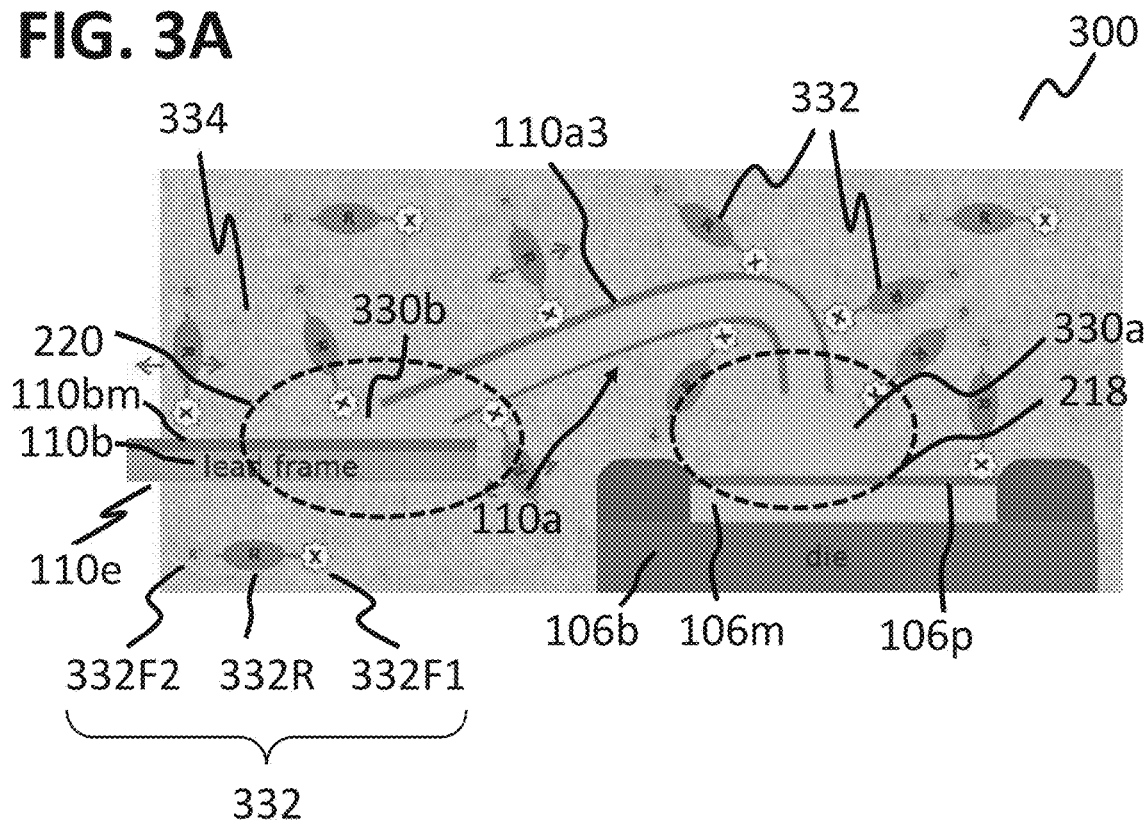
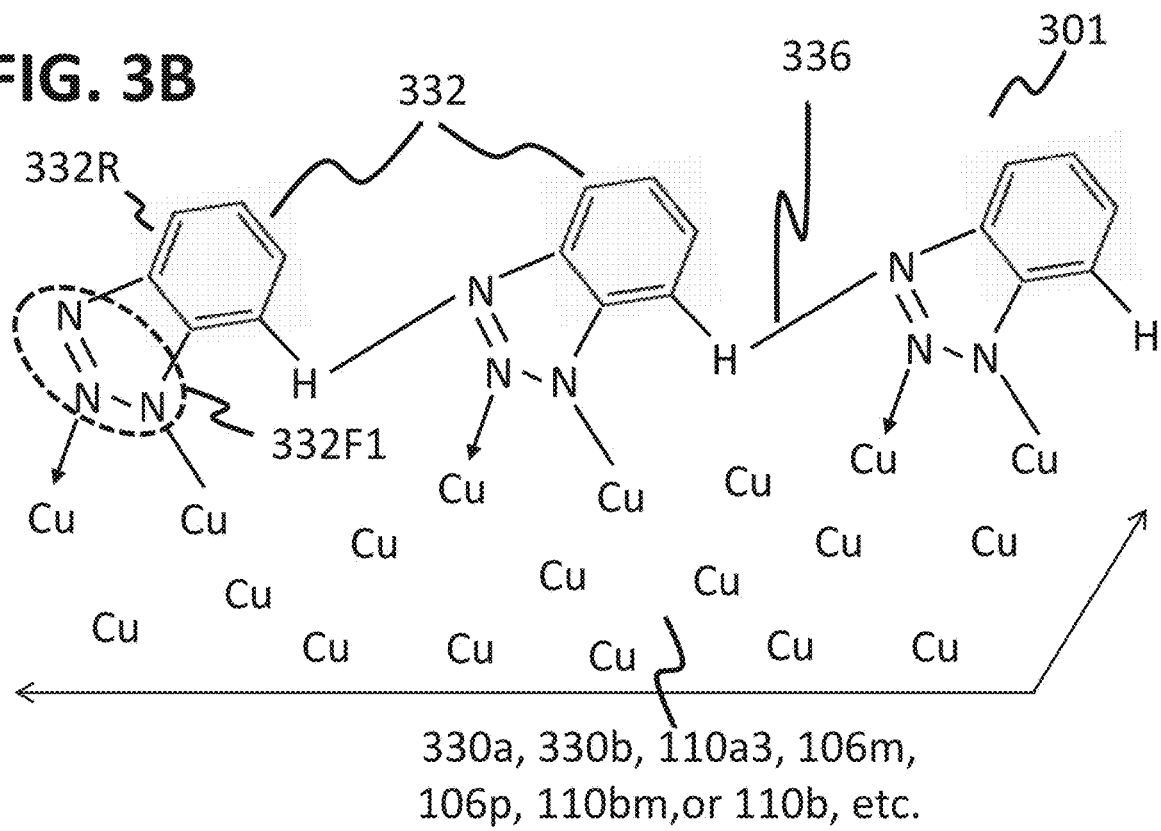

FIG. 5

```
500
 │
 ▼
┌─────────────────────────────────────────┐
│ electrically contacting a metal contact │  510
│ structure to a chip metal surface of a  │
│ chip                                    │
└─────────────────────────────────────────┘
                    │
                    ▼
┌─────────────────────────────────────────┐
│ arranging a chemical compound in        │  520
│ physical contact with at least one of   │
│ the metal contact structure and the     │
│ chip metal surface, wherein the         │
│ chemical compound is configured to      │
│ improve the adhesion between the metal  │
│ contact structure and a packaging       │
│ material and/or between the chip metal  │
│ surface and the packaging material, as  │
│ compared with an adhesion in an         │
│ arrangement without the chemical        │
│ compound, and wherein the chemical      │
│ compound is essentially free from       │
│ functional groups including sulfur,     │
│ selenium or tellurium                   │
└─────────────────────────────────────────┘
                    │
                    ▼
┌─────────────────────────────────────────┐
│ at least partially encapsulating the    │  530
│ chip and the metal contact structure    │
│ with packaging material, wherein the    │
│ packaging material is in physical       │
│ contact with the chemical compound      │
└─────────────────────────────────────────┘
```

US 10,672,678 B2

METHOD FOR FORMING A CHIP PACKAGE WITH COMPOUNDS TO IMPROVE THE DURABILITY AND PERFORMANCE OF METAL CONTACT STRUCTURES IN THE CHIP PACKAGE

CROSS-REFERENCE TO RELATED APPLICATION

This application is a continuation-in-part of U.S. application Ser. No. 15/600,843, filed on May 22, 2017, which claims priority to German Patent Application Serial No. 10 2016 109 352.1, filed on May 20, 2016, both of which are entirely incorporated herein by reference.

TECHNICAL FIELD

Various embodiments relate generally to a chip package and a method of forming a chip package.

BACKGROUND

A chip package may usually include a chip, a metal contact structure electrically contacting the chip, and packaging material at least partially enclosing the chip and the metal contact structure. For example, the metal contact structure may provide an electrically conductive connection to the chip from outside the packaging material. The metal contact structure may include a bond wire, which may include or consist of copper (Cu). Bond wires made of bare Cu material may have a significant cost advantage compared to gold (Au) wire, which has been, and still is, the main wire material used. However, Cu wire may have some technological disadvantages and drawbacks, which hindered its rapid usage and industrial acceptance. For example, copper is easily oxidized at ambient air. Therefore, its shelf life time is very limited and strict rules may be applied in assembly fabs (e.g. shipment in sealed packages with inert media, limited hours of usage once the sealed package is opened, etc.).

Furthermore, Cu bond interconnects may often and more easily (e.g. more easily than interconnects using gold wire) undergo corrosion in stress tests using moisture levels (e.g. Temperature Humidity Bias (THB), Highly Accelerated Stress Test (HAST), Unbiased Temperature/Humidity Accelerated Stress Test (UHAST), or Unbiased Temperature/Humidity Autoclave (AC)).

And yet furthermore, Cu wedge bond interconnects may show weak bonding and adhesion, especially on surfaces which are coated with noble metals (e.g. gold (Au), silver (Ag), or palladium (Pd)) and which have a smooth, not roughened surface.

Similar drawbacks may occur for silver (Ag) wires used as bond wires, and/or for other metal contact structures, e.g. bumps, micro-bumps, pillars, clips, springs, etc.

SUMMARY

In various embodiments, methods for forming a chip package are provided. The chip package may include a chip including a chip metal surface, a metal contact structure electrically contacting the chip metal surface, a packaging material at least partially encapsulating the chip and the metal contact structure, and a chemical compound physically contacting the packaging material and at least one of the chip metal surface and the metal contact structure, wherein the chemical compound may be configured to improve an adhesion between the metal contact structure and the packaging material and/or between the chip metal surface and the packaging material, as compared with an adhesion in an arrangement without the chemical compound, wherein the chemical compound is essentially free from functional groups including sulfur, selenium or tellurium.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which:

FIG. 3A shows a schematic cross section of a chip package according to various embodiments;
FIG. 3B shows schematically chemical bonds between molecules of a chemical compound and a metal surface according to various embodiments;
FIG. 5 shows a process flow for a method of forming a chip package according to various embodiments.

DESCRIPTION

Figure 1A:
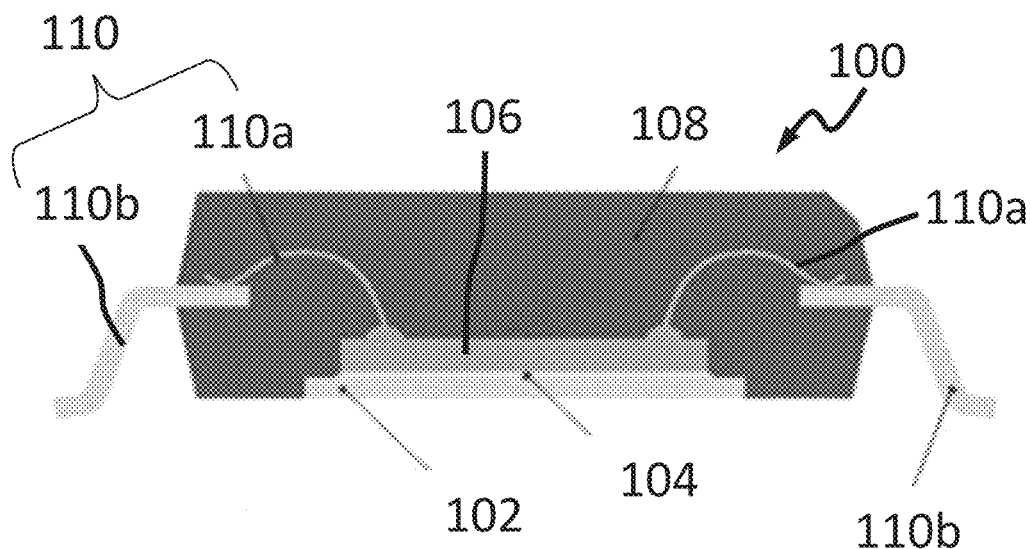
FIG. 1A shows a cross sectional view of a chip package.

The following detailed description refers to the accompanying drawings that show, by way of illustration, specific details and embodiments in which the invention may be practiced.

The word "exemplary" is used herein to mean "serving as an example, instance, or illustration". Any embodiment or design described herein as "exemplary" is not necessarily to be construed as preferred or advantageous over other embodiments or designs.

The word "over" used with regards to a deposited material formed "over" a side or surface, may be used herein to mean that the deposited material may be formed "directly on", e.g. in direct contact with, the implied side or surface. The word "over" used with regards to a deposited material formed "over" a side or surface, may be used herein to mean that the deposited material may be formed "indirectly on" the implied side or surface with one or more additional layers being arranged between the implied side or surface and the deposited material.

Various aspects of the disclosure are provided for devices, and various aspects of the disclosure are provided for methods. It will be understood that basic properties of the devices also hold for the methods and vice versa. Therefore, for sake of brevity, duplicate description of such properties may have been omitted.

Many of the examples presented herein refer to a "sulfur-induced corrosion phenomenon" with copper (Cu), having Cu-sulfide ($CuS_x$) as corrosion product or with silver (Ag) having silver sulfide ($AgS_x$) as corrosion product. It should be noted that copper/silver, sulfur and their reaction products should be understood only as representative examples of reaction partners and reaction product, respectively, of a chemical reaction giving rise to the corrosion phenomenon, and not as the only and exclusive reaction partners, reaction product and corrosion phenomenon, respectively. Examples of materials and bond wires, respectively, which may be expected to be affected by the corrosion phenomenon include Cu-wire, palladium (Pd)-coated Cu wire, Au/Pd-coated Cu wire, Pd-doped Cu wire, Cu-wire doped with other noble metals, Ag-wire, doped Ag-wires, and coated Ag-wires. Similar corrosion reactions may occur with various other elements listed in the group VI (or 16) of the periodic table of elements (e.g. oxygen, sulfur, selenium, tellurium). A presence of more than one of these elements may aggravate the corrosion phenomenon.

Many of the examples herein describe, as a metal contact structure electrically contacting the chip, a wire contacting both, the chip and a leadframe. The wire and the leadframe are to be understood as representative examples of any kind of suitable metal contact structure (also referred to as interconnect) that may be prone to the corrosion phenomenon described herein, e.g. metal contact structures including or consisting of copper and/or silver, with or without a noble metal coating. The metal contact structure may for example include or consist of a lead frame, a bond wire, an interconnect that may provide an electrical contact between a chip and a package substrate, between multiple chips, or between the chip and other materials. Such interconnects may for example include bumps and micro-bumps, pillars, clips, springs, metal fillings in e.g. "through encapsulation" or "through mold compounds" or "through silicon" vias or other interconnects for 3-dimensional or vertical connection, metal layers on or in a (e.g. polymer) substrate of the package, chip top front side metallization, redistribution layers, and/or a chip backside metallization.

Furthermore, other metal surfaces (including or consisting of the metals that may be prone to the corrosion, e.g. copper or silver) arranged in the package may be prone to the corrosion effect, for example passive components (e.g. inductors, capacitors, resistors), either on the chip or in the package, and other surfaces and components that may get in contact with the harmful components.

Thus, leadframes, pads and other metal surfaces shown here are to be understood as representative examples. The corrosion reaction may also take place on other surfaces (e.g. metal surfaces) and interfaces (e.g. metal-packaging material interface) not explicitly shown.

Furthermore, the Cu wedge bond interconnects may show weak bonding and adhesion, especially on surfaces which are coated with noble metals (e.g. gold (Au), silver (Ag), or palladium (Pd)) and which have a smooth, not roughened surface.

In general, conventional Cu bond interconnects may often and more easily (e.g. more easily than interconnects using gold wire) undergo corrosion in stress tests using moisture levels.

In order to overcome these problems, bond wire manufacturers are offering e.g. Cu wires that may be coated with noble metals like Pd, Pt or Au or Pd and Au or which may be doped with such noble metals. Similarly, Ag wires with noble metal coating or doping may be offered. It had been expected that such noble metal coatings and dopings significantly reduce the oxidation and corrosion issues mentioned above. A typical example of such a coated wire $110a$ is shown in FIG. 1B. The coated wire $110a$ may include a core $110a0$, which may for example include or consist of copper, a diffusion layer $110a1$, which may include or consist of copper-palladium Cu—Pd, a palladium layer $110a2$, and a gold-palladium layer $110a3$.

However, it was found out that the noble metal coatings and dopings of Cu or Ag wires and other new or modified materials may significantly (may be even exclusively) contribute to a new corrosion problem explained in more detail below.

The problem has only been observed recently, and no solution appears to have been found so far. Reasons why the problem has not been observed in the past may include that mainly Au-wire has been used in the past, with Cu-wire (and particularly various new flavors of doped and coated Cu or other wire) having been introduced only recently, that new materials and surfaces have been introduced into electronic packages only recently, that changes to composition of molding compounds and other package materials have been made by suppliers only recently (e.g. adjustment of molding compound to improve an adhesion to new leadframe surfaces like Pd Au or AuAg), and that devices are used in new and more aggressive applications only recently (e.g. operation at temperatures of 150° C. and above for extended duration (e.g. 1000 hours and well above), or in ambient conditions which contain corrosive components (e.g. exhaust gases)), or recent applications in automotive and industrial market that call for operation over periods of 45000 h in total (trucks) or for operation at 70° C. for 70000 h in hybrid e-vehicle applications.

Bond wires of certain type (e.g. Cu-wire, Pd-coated Cu wire, Au/Pd-coated Cu wire, Pd-doped Cu wire, Cu-wire doped with other noble metals, Ag-wire, doped Ag-wires, coated Ag-wires, etc.) in packaged products may be attacked and corroded during operation or storage at elevated temperatures or during HTS tests or after stress combinations like moisture followed by high temperature stress, e.g. UHAST 48 h+HTGS at 175° C.

The corrosion may lead to a weakening or loss of bond adhesion at a $1^{st}$ and $2^{nd}$ bond (e.g. nailhead to pad, wedge to leadframe or substrate), and/or to a weakening of the mechanical strength of the wire due to material loss or structural change.

The corrosion may further lead to an electrical fail of the interconnect and of the device during operation before an anticipated end of life is reached. Core wire material has been observed to creep along the noble metal coating of the wire and to cover the whole wire. Additionally, core wire material has been observed to form dendrites into the molding compound under certain conditions.

According to analytical investigations, a root cause for corrosion of the mentioned wire materials may be an attack of e.g. Cu metal by e.g. sulfur containing components, leading to the formation of e.g. $CuS_x$ compounds. This corrosion reaction may especially be observed at a periphery of the $1^{st}$ bond or the $2^{nd}$ bond, an interface of the $1^{st}$ bond and of the $2^{nd}$ bond (e.g. to pad, leadframe or substrate), and/or within a wire loop (creation of pittings behind small defects in the coating)

Figure 1B:
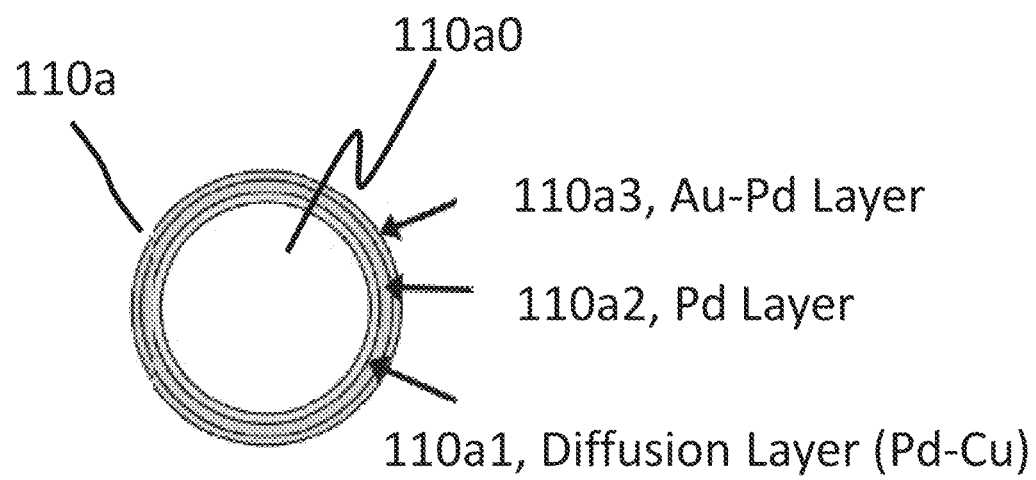
FIG. 1B shows a cross sectional view of a bond wire.

FIG. 1A shows a cross sectional view of a chip package 100, and FIG. 1B shows a cross sectional view of a bond wire $110a$.

Figure 2:
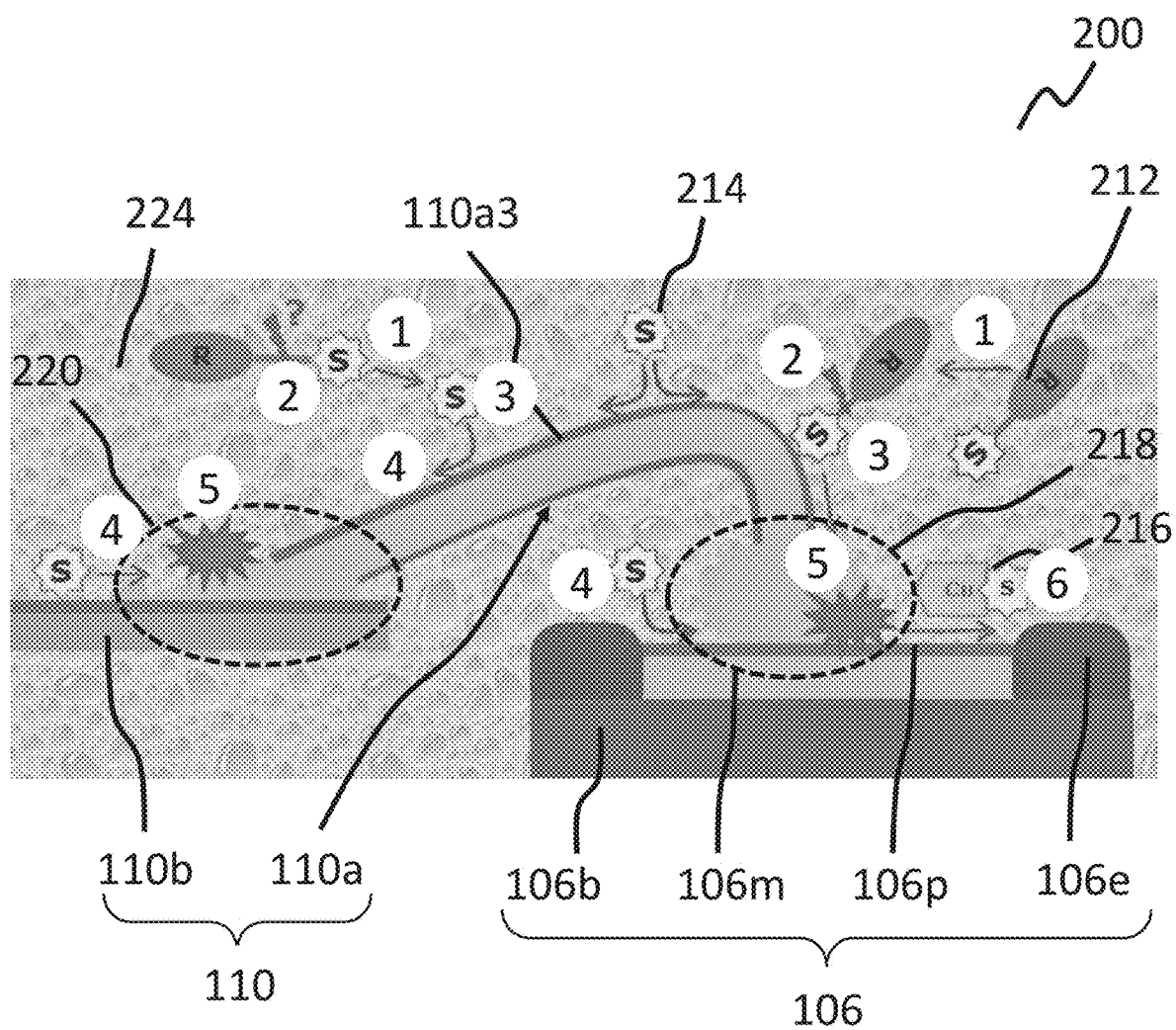
FIG. 2 shows a schematic cross section visualizing a corrosion process on metal surfaces in a chip package.

FIG. 2 shows a schematic cross section 200 visualizing a corrosion process on metal surfaces in a chip package.

The chip package may include a chip 106. The chip 106 may include a chip base $106b$, which may for example include or consist of a semiconductor material, e.g. silicon. The chip 106 may further include a chip metal surface $106m$, which may be protected by a cap layer $106p$. The chip 106 may further include a chip edge region $106e$.

The chip package may further include a metal contact structure 110, which may be electrically contacting the chip 106 (at the chip metal 106m). The metal contact structure 110 may include a wire 110a, which may be the portion of the metal contact structure 110 that may be electrically and physically contacting the chip 106 in a contact region 218. The electrically conductive contact may be formed as a so-called nailhead contact (due to a nailhead shape of the contacting end of the wire 110a). The wire 110a may be identical or similar to the wire 110a shown in FIG. 1A and FIG. 1B.

The metal contact structure 110 may further include a portion 110b. The portion 110b of the metal contact structure may provide an electrically conductive connection between the wire 110a and an outside of the package. An electrically conductive contact between the wire 110a and the portion 110b of the metal contact structure 110 may be wedge-shaped (the wedge shape may be caused by a pressure applied during a contacting process).

The chip package may further include packaging material 224, also referred to as molding compound. The packaging material 224 may for example include a resin or any other suitable dielectric packaging material 224 that may be used for being molded at least partially around the chip 106 and the metal contact structure 110. The packaging material 224 may at least partially encapsulate the chip 106 and the metal contact structure 110. The packaging material 224 may be in physical contact with surfaces, e.g. metal surfaces, of the chip 106 and/or of the metal contact structure 110. The packaging material 224 may for example be molded around the chip 106 and the metal contact structure 110. The chip and the metal contact structure may for example be hermetically encapsulated by the packaging material 224, wherein only ends of the metal contact structure 110, and optionally a back side of the chip 106, free from the encapsulation material 224 for providing an electrically conductive connection between the chip 106 and an outside of the chip package.

It has been observed that packaged products, for example metal surfaces in the chip package 100, e.g. the metal surface 106m of the chip 106 and/or of the metal contact structure 110 electrically contacting the chip 106, may be attacked and corroded during operation or storage at elevated temperatures or during high temperature storage (HTS) tests. A detrimental impact of other factors (e.g. humidity, bias, etc.) may not be excluded. Furthermore, the corrosion reaction may not be limited to high temperatures (e.g. ≥150° C.). It is observed to occur at significantly lower temperatures, even down to room temperature.

A rate of the reaction may depend on several parameters like concentrations of various species, temperature, texture and composition of metals, moisture level, etc., and thus an impact on operating lifetime of devices may be much more detrimental than initially observed in purely thermally accelerated investigations.

The corrosion may lead to a weakening or loss of adhesion at a $1^{st}$ bond (which may for example be a bond of a so-called "nailhead" of the wire 110a to the chip 106, e.g. to a metal surface 106m of the chip 106, which may also be referred to as a pad, a bond pad, or a metal pad) and/or at a $2^{nd}$ bond (which may for example be a bond of a so-called "wedge" (e.g. a pressed, and thus wedge-shaped end of the wire 110a) to the second portion 110b of the metal contact structure 110, e.g. a leadframe or a substrate). The corrosion may lead to an electrical fail of an interconnect and of a device, e.g. the chip package, during operation before an anticipated end of life is reached. Thus, a reliability of the device, e.g. the chip package, may be decreased.

Corrosion phenomena that have been observed in chip packages may have been caused by elements listed in group VI of the periodic table of elements, e.g. oxygen, sulfur, selenium, tellurium. In these observed examples, a location of the corrosion mainly focused on the bond wire 110a and its interfaces to e.g. the bond pad (on a top surface of the chip 106) or to the lead frame 110b.

However, the corrosion may also occur on any other surface or material that may be prone to the corrosion reaction described below or may be attacked by components containing the above mentioned harmful elements. A risk of corrosion may increase especially if the respective surface or material (e.g. metal surface or material) is in direct contact with the harmful component.

As an example, a corrosion attack on the nailhead of the wire 110a, on the metal bond pad 106m of the chip 106, and on the wedge end of the wire 110a is shown in FIG. 2.

In this example, the bond pad 106m may mainly include copper (Cu) metal. However, the corrosion may readily occur if the bond pad 106m mainly consists of any of the above mentioned metals that are prone to be attacked, of which the copper (Cu) is one example, and if the top surface of the pad 106m is not protected.

Corrosion may, however, also occur if the pad 106m has been protected by a thin (e.g. thinner than 20 nm) cap layer 106p of e.g. Pt, Au, SiN, SiCN, $Al_2O_3$ or others. Such a cap layer 106p may be used to avoid an oxidation of the (Cu) pad 106m in an ambient environment after finishing a wafer production process. However, such a cap layer 106p may be (intentionally or unintentionally) disturbed by an impact of a bonding process in order to achieve a good mechanical and electrical contact once the singulated chips 106 are going to be packaged. At the disturbed locations 330a, 330b, exposed core material 110a0 may be prone to the corrosive attack.

The corrosion may continuously be ongoing (especially at elevated temperatures that may for example be caused by device operation or ambient temperature) and may finally lead to a disruption of the mechanical and electrical contact and to a functional failure of the device.

The corrosion reaction may not be restricted to occur only with surfaces or materials which mainly consist of Cu metal, but may also occur with surfaces or materials as described above and which might be attacked by components containing harmful elements.

Furthermore, the corrosion reaction may not be restricted to occur at the chip pad 106m. In general, surfaces or package components that may be prone to the corrosion phenomenon may include bond or contact pads 106m (either with initial protection by a cap layer 106p or without), the portion 110b of the metal contact structure 110, e.g. lead frames, or other substrate materials containing the above mentioned metals, other interconnects than bond wires that may provide an electrical contact between a chip and a package substrate, between multiple chips, or between chip and other materials, which may include the metal contact structure 110 and other metal contact structures. Such interconnects may include bumps and micro-bumps, pillars, clips, springs, metal fillings in e.g. "through encapsulation" or "through mold compounds" or "through silicon" vias or other interconnects for 3-dimensional or vertical connection, metal layers on or in a (e.g. polymer) substrate of the package, chip top front side metallization, redistribution layers, chip backside metallization, passive components (e.g. inductors, capacitors, resistors), either on the chip or in the package, and other surfaces and components that may get in contact with the harmful components.

A model for a mechanism of the corrosion reaction is described below. A sequence of processes of the mechanism explaining transport kinetics and a degradation mechanism is schematically shown in FIG. 2 for an exemplary case of a palladium (Pd)-coated copper (Cu) wire in combination with sulfur species. The model may similarly apply to other materials and material combinations as described herein. The individual processes of the multi-step process are labelled by figures from 1 to 6.

In the example shown in FIG. 2, the nailhead in the first contact region 218, also referred to as bond region 218, and the pad 106m basically consist of the same element (e.g. Cu). Therefore, a galvanic element is not likely to form, and the mechanism of the corrosion may be different from those typically observed and described in the literature (e.g. corrosion in humid atmosphere, formation of local or galvanic elements, corrosion via formation of ions, are not likely to occur in this case).

Sulfur containing material, e.g. sulfur containing molecules 212 in the packaging material 224 (either made available intentionally or as contamination), may diffuse through the packaging material 224 (the molding compound) (marked with 1).

The sulfur-containing molecules 212 may easily and catalytically be decomposed (marked with 2) to a large extent, e.g. at low temperatures, leading to smaller S-containing fragments 214 that may be strongly adsorbed onto the noble metal surfaces, e.g. Pd-surfaces, e.g. the coating 110a3 of the wire 110a (marked with 3).

The decomposition products (adsorbed S-containing fragments 214) may easily and rapidly diffuse along the noble metal surfaces, e.g. the palladium (Pd) surface (marked with 4).

Whenever they reach unprotected Cu (or Ag) metal, the adsorbed S-containing fragments (also referred to as S-containing species) 214 may react irreversibly with the unprotected metal, e.g. the unprotected Cu- or Ag-wire, to form copper sulfide $CuS_x$ 216 or silver sulfide $AgS_x$, respectively (marked with 5). Unprotected Cu may mainly, or even only, be available at a location of the $1^{st}$ bond 218 and of the $2^{nd}$ bond 220 due to the bonding process, e.g. a FAB (free air ball) process or a wedge process. Therefore, these interconnect regions 218, 220 may degrade rapidly, which may lead to mechanically weak interconnects and to electrical failures.

The reaction products 216 (e.g. $CuS_x$ or $AgS_x$) may migrate easily along surfaces and interfaces due to creep corrosion (marked with 6). Especially sulfides of noble or semi-noble metals (e.g. Ag, Cu) may be prone to creep corrosion on surfaces of noble metals (e.g. Au, Pd) and on surfaces of organic materials (e.g. polyimide, mold resin). Therefore, no self-passivation but rapid corrosion of such metal interconnects may take place.

The corrosion reaction may be catalyzed or enhanced by the presence of the noble metals such as e.g. Pd, Pt, Au, and/or by alloys, by intermetallic compounds or by solid solutions of such noble metals, or by other intermetallic compounds like e.g. $AlCu_x$.

A root cause of the corrosion may thus be an attack of metal, e.g. Cu or Ag, by e.g. sulfur containing components (or chemically similar materials from group VI of the periodic table of elements, like e.g. O, Se, Te), leading to the formation of e.g. $CuS_x$ compounds. This corrosion reaction may be especially observed at a periphery of the $1^{st}$ bond and/or the $2^{nd}$ bond, interfaces of the $1^{st}$ and $2^{nd}$ bond (e.g. to pad, leadframe or substrate).

A source of the corrosive agent sulfur (or chemically similar materials as mentioned herein, e.g. other group VI elements, e.g. oxygen, sulphur, selenium, and/or tellurium) may for example include or consist of components of the packaging material (the molding compound) 224, in which the chip 106 and the metal contact structure 110 may at least partially be encapsulated. The components of the molding compound 224 acting as the source of the corrosive agent may for example be a resin polymer, adhesion promoter, colouring material, etc., or a contamination contained in the molding compound and its ingredients. Other sources of the corrosive agent may be or include other components within the package, e.g. glue for die attach, a contamination contained therein, and/or one or more components or contamination of the ambient (e.g. $H_2S$, $SO_2$, elementary sulfur, etc.).

An overall reaction rate may be influenced by further additives and contaminations. For example, ion catchers (e.g. catchers for $Cl^-$, $OH^-$) may be present in the mold compound, and/or moisture may be present at or near reaction sites. The corrosion reaction may not be limited to high temperatures (e.g. ≥150° C.), but may be observed to occur even at significantly lower temperatures, down to room temperature. Furthermore, the rate of the corrosion reaction may depend on several parameters like concentration of various species, temperature, texture and composition of metals, moisture level, electrical bias etc., and thus impact on operating lifetime of devices can be much more detrimental than initially observed in purely thermally accelerated investigations. Thus, for the intrinsic degradation mechanism, several further influencing factors may have to be expected in package and product environment, leading to a varying extent of degradation that may be difficult to predict and/or control.

While the noble metal coating 110a3 may protect the copper core 110a0 of the wire 110a in most regions, it may catalyze a chemical reaction with the sulfur in regions where the copper is not protected, for example in the contact regions 218, 220.

A transport of adsorbed species 214 along the noble metal surfaces, for example along the wire with the coating 110a3, may be very fast.

The reaction products 216 may be prone to creep corrosion, therefore voluminous voids may grow.

According to our investigations and research work, the mentioned degradation or corrosion may be caused to a non-negligible extent by certain materials or compounds that may be used in the assembly and packaging process. In particular, the corrosion may be caused—amongst others—by materials like organic thiols and derivates of the type R—X—R", organic sulfides and derivates of the type R—(X)$_n$—R', sulfur containing heterocycles or thiophenes with R=any organic root (which may also be referred to as organic residual), either aliphatic (e.g. —$CH_3$, —$C_2H_5$, . . . ) or aromatic (e.g. -phenyl or other aromatic root), R'=—H or any organic root, either aliphatic (e.g. —$CH_3$, —$C_2H_5$, . . . ) or aromatic (e.g. -phenyl or other aromatic root), R"=H, X being S, Se, or Te, and n≥2.

Such compounds may be used in certain materials or process steps in order to e.g. foster or improve the adhesion between metal surfaces and polymer materials. However, in the presence of noble metals like Pd, Pt, Au, the organic thiols and sulfides may tend to decompose at relatively low temperatures (<200° C.) and attack metals which may be in use as, e.g., core bond wire materials (e.g. Cu, Ag), thereby forming e.g. $CuS_x$ or $AgS_x$.

Simply removing or not using such materials in a bill of materials (BoM) of a packaged device may help to reduce or avoid the corrosion degradation. On the other hand, other detrimental issues like delamination or weak adhesion of e.g. organic materials to metal surfaces may be an unwanted consequence and may limit or negatively impact a lifetime of the device under operational conditions.

In various embodiments, one or more materials to support or increase an adhesion between e.g. metal surfaces and a packaging material, e.g. polymer material, may be used. The material(s) may increase the adhesion between a metal surface, e.g. of a chip and/or of a metal contact structure, and the packaging material, as compared to a situation without the material(s).

According to various embodiments, the corrosive attack of bond wires and/or other metal surfaces in the chip package by aggressive sulfur-containing or other components may be either significantly reduced or completely avoided. This may be achieved by using certain alternative and specified materials or compounds in the assembly and packaging process that may provide, support or enhance strong bonding and adhesion to metal surfaces and which may not cause the corrosion issue. These proposed materials may be used as an addition to materials and processes used in assembly and packaging, as a replacement of or alternative to certain materials in processes used in assembly and packaging, or as a pretreatment or pre-processing in processes used in assembly and packaging.

In various embodiments, the proposed materials may use other than S-, Se-, or Te-containing functional groups, for example —$SiR_3$, —$NR_2$ or others, which may provide excellent adhesion between metals and polymers and/or, which may not form 3-dimensional reaction products with the metal and/or which may not form, after a reaction with the metal, 3-dimensional reaction products that undergo creep corrosion. The materials may be used additionally or exclusively.

In various embodiments, a wire bond interconnect degradation may be prevented by alternative adhesion enhancing materials and methods.

In various embodiments, a corrosion risk for bond wires and metal surfaces may be reduced or eliminated, even if the bond wire(s) and/or the metal surfaces may be coated with noble metals.

In various embodiments, one or more adhesion enhancing material of a group of adhesion enhancing materials may be used. The group of adhesion enhancing materials may include:

(1) materials of a type $R'_{(4-x)}$—Si(—O—R)$_x$, which may include at least one functional group of the type —Si(—O—R)$_x$ (siloxane or substituted siloxane) and which may bond to metals M at least via one or more bonds of the type —Si—O-M, (2) materials of a type $R'_{(4-x)}$—Si(R)$_x$, which may include at least one functional group of a type —Si(—R)$_x$ (Si—R=e.g. Si-amine, -diamine, triamine, -diethylenetnaminetetraacetate (TAAcOH), -3-[2-(dimethylamino)ethyl]indole (DMT)), and which may bond to metals M at least via one or more bonds of a type —Si—N-M, (3) materials of a type R'—$NH_yR_{(2-y)}$, which may include at least one functional group of a type —$NH_yR_{(2-y)}$ (amino or substituted amino group), and which may bond to metals M at least via one or more bonds of a type —N-M, (4) materials of type (3), in which the functional amino group is part of or attached to an heterocycle with one or more additional N-atoms like benzotriazol, tolyltriazol, imidazole, other azoles or derivate thereof, (5) materials of a type R'R—C≡NR or R'—N≡CR, which may include at least one functional group of the type —C≡NR (cyanide) or —N≡CR (isocyanide) or derivate thereof and which may bond to metals M at least via one or more bonds of a type —N-M, (6) materials of a type R—C≡N═O (cyanates) or R'—N═C═O (isocyanate), which may include at least one functional group of the type R—C≡N═O (cyanate) or R—N═C═O (isocyanate) or derivate thereof, and which may bond to metals M at least via one or more bonds of the type —N-M, (7) materials that may include at least one or more functional groups according to the material (1) (siloxane type) and one or more functional groups according to materials (2), (3) or (4) (N-type) in the same molecule. Such compounds may be commercially made available e.g. by the company Gelest, Inc, Morrisville, Pa., USA under the name "Silane Coupling Agents", (8) aromatic or alkylic N-containing molecules, e.g. quinones like tetracyanoquinodimethane (TCNQ, (NC)$_2CC_6H_4C(CN)_2$); tetracyanoethylene (TCNE, $C_2(CN)_4$) or others, which may be electron-rich and which may form strong bonded complexes with certain metals via their —CN-ligands and/or their π-electrons, (9) materials of the type R'—COOR, which may include at least one functional group of the type —COOR (carboxylate) and which may bond to metals M at least via one or more bonds of the general type —C—O-M (oxygen containing organic groups, e.g. as carbonyl groups) or derivates thereof (e.g. derivates of organic carboxyl-acids), which may be electron-rich and which may form strong bonded complexes with metals via their —CO-ligands and/or their π-electrons,

(10) materials of a type RR'—POOR or RR'—POR, which may include at least one functional group of a type —POOR or —POR (derivates of phosphorous or phosphoric acid) and which may bond to metals M at least via one or more bonds of a type —P—O-M,

(11) materials that may include epoxygroups as functional groups (E-R), like an aminopropyloxirane molecule,

(12) materials that may include more than one type of any functional group mentioned above in the same molecule like $R'_{(4-x)}$—Si(—O—R")x with R"=phosphino- or phosphatogroup (phosphino-alkoxysilanes) or like $CR_2(NR_2)$—$(CR_2)_x$—Si(OR)$_3$ with R=any organic root, and x≥1. Only one of the functional groups may coordinate with the metal surface, because of e.g. differences in bonding strengths or steric reasons. Therefore, the second functional group may be available to coordinate with functional groups of the molding compound and thus excellent adhesion may be provided between metal and the polymer material,

(13) bi-functional substituted steric hindered compounds (e.g. dicyclopentadiene, adamantan, urotropin, cyclodextrins, kryptands, etc.). Only one of the functional groups may coordinate with the metal surface, because of the steric hindrance. Therefore the second functional group may be available to coordinate with functional groups of the molding compound, and thus excellent adhesion may be provided between the metal and the polymer material,

(14) bi-functional aromatic and multiaromatic compounds (e.g. naphthene, anthracene, phenanthrene, etc.) that may show intermolecular interactions, e.g. ππ interactions.

They may align in a manner in which only one of the functional groups may coordinate with the metal surface and the second functional group may be available to react with functional groups of the molding compound. Thus excellent adhesion may be provided between metal and the polymer material.

Herein, R'— denotes any organic root, either aliphatic (e.g. —$CH_3$, —$C_2H_5$, . . . ) or aromatic (e.g. -phenyl or other aromatic root based on either pure hydrocarbons or with one or more heteroatoms like N, P, . . . ), R— denotes hydrogen —H or any organic root, either aliphatic (e.g. —$CH_3$, —$C_2H_5$, . . . ) or aromatic (e.g. -phenyl or other aromatic root based on either pure hydrocarbons or with one or more heteroatoms like N, P, . . . ), M- denotes any metal, x=1, 2, or 3, and y=1 or 2.

The mentioned materials may be seen as representatives of their chemical group or class. These groups may be selected because they form strong bonds to metal surfaces, and/or because they do not form 3-dimensional reaction products with metals, which would lead to corrosion phenomena.

The above mentioned materials may be known or expected to improve an adhesion between organic materials and metal surfaces, but are at present not applied in microelectronic packages with the material combinations mentioned above. Some of the materials may be also known as corrosion inhibitors in other applications (e.g. refineries and oil drilling business), where their strong bonding to metal surfaces may be made use of.

In various embodiments, the above mentioned materials (1) to (14) may be applied in microelectronic packages with the material combinations (e.g. of the metal surfaces and the packaging material) mentioned above.

In various embodiments, the above mentioned materials (1) to (14) may also be used with any other type of bond wire not mentioned in this document.

In various embodiments, the above mentioned materials (1) to (14) may be used as an alternative to e.g. S-, Se- or Te-containing components, which may also adhere strongly to certain metal surfaces (e.g. Pd, Au, Pt), but which may show detrimental corrosive attack with other metals (e.g. Cu or Ag). In contrast to e.g. S-, Se, Te-containing compounds, no corrosive attack of metals may be expected from the materials proposed in this document.

In various embodiments, the above mentioned materials (1) to (14) may be included in the molding compound as a partial or full replacement for components currently used in there, or as an addition.

In various embodiments, the chip package or chip package surfaces may be treated with one of the mentioned materials first. Due to the strong bonding to metals, the metal surfaces of the package may be blocked and protected by these materials or fragments thereof. In a second step, the package may be treated with the molding compound according to the state of the art, wherein the molding compound may contain e.g. S-, Se- or Te-containing components (wherein the S-, Se- or Te-containing components—without performing the first process step—potentially might lead to corrosion attack). In various embodiments, it may be an advantage of this sequential process that any commercial molding compound according to the state of the art might still be used and available, and proven processes may not have to be changed.

In various embodiments, materials as mentioned above that may include more than one type of any functional group in the same molecule might already be attached to another component of the package, e.g. to the packaging material, e.g. to a polymer resin, by one of its multiple functional groups. One or more other functional groups in the same molecule, which may not yet be fully coordinated, might be used to coordinate towards or bond to one or more metal surface(s) in the package.

In various embodiments, the processes may easily be integrated into a standard process flow as used in backend fabrication lines for microelectronic products. Other processes used in such fabrication lines like plasma treatment and/or wet treatment (e.g. for pre-cleaning or for roughening a surface) may also be applied.

In various embodiments, combinations of at least two different functional groups may be present in the chemical compound in any arrangement and combination, in self-assembled arrangements or coordination, and/or in steric hindered compounds or coordination.

In various embodiments, materials may be used that do not form 3-dimensional reaction products with the metal and/or which do not form reaction products with the metal which undergo creep corrosion. To support or improve an adhesion to metal surfaces, materials with functional groups other than S-, Se- or Te-containing materials may be used additionally or exclusively.

In various embodiments, the materials, for example the chemical compound, may be included in a molding compound, either as a partial or full replacement for components of the packaging material, e.g. currently used packaging material, or as an addition.

In various embodiments, a (pre-)treatment of the package or package surface(s) with at least one of the above mentioned materials may be performed. Thereby, a blocking and protection of metal surfaces may be achieved, followed by a molding process with a mold compound according to state of the art or a mold compound according various embodiments.

In various embodiments, materials as specified herein and containing more than one type of any functional group in the same molecule may already be pre-attached to another component of the package, e.g. to the packaging material, e.g. a polymer resin, by one of its multiple functional groups. The $2^{nd}$ functional group in the component may be used to bond to the metal.

In various embodiments, the processes of the method of forming a chip package may be integrated into a standard backend process flow, including, e.g., pre-cleaning and/or surface roughening processes.

In various embodiments, as shown in FIG. 3A in a cross-sectional schematic view 300, a chip package may be provided.

The chip 106 and the metal contact structure 110 of the chip package of FIG. 3A may be similar or identical to the chip 106 and the metal contact structure 110 of FIG. 2, and their description is not repeated here.

However, the packaging material 334 may differ from the packaging material 224 of FIG. 2.

In various embodiments, the packaging material 334 (the molding compound) may further include a chemical compound 332. The chemical compound 332 may in various embodiments be essentially free from functional groups including sulfur, selenium or tellurium. "Essentially free" may in this context be understood as including less than 10 at-ppm of sulfur, selenium or tellurium. In various embodiments, the chemical compound 332 may be free from functional groups including sulfur, selenium or tellurium.

In various embodiments, the chemical compound 332, as part of the packaging material 334, may be arranged after the electrical contacting the chip 110 with the metal contact structure 110.

The chemical compound 332 may include a plurality of molecules, each molecule of the plurality of molecules including at least a first functional group 332F1 bound to a hydrogen atom or to an organic root 332R (wherein the term "organic root" may be understood to refer to an aliphatic and/or aromatic portion of the chemical compound 332).

Properties of individual molecules of the chemical compound 332 may herein for short be referred to as, e.g., "the chemical compound 332 may include . . . ", which may be understood as an abbreviation of "each molecule of a plurality of molecules of the chemical compound 332 may include . . . ".

In various embodiments, the chemical compound 332 may further include a second functional group 332F2 bound to the organic root 332R.

In various embodiments, the functional group 332F1 (and, if present, the functional group 332F2) of the chemical compound 332 may not include S, Se, or Te. Instead, the functional groups may for example include silicon or nitrogen (thus forming, e.g., —$SiR_3$, —$NR_2$) or others, which may provide excellent adhesion between, on the one hand, a metal surface, for example the chip metal surface 106m (or, in a case of a cap layer 106p being formed, the cap layer 106p) of the chip 106, and/or of the metal contact structure 110, and, on the other hand, the packaging material 334, e.g. a polymer, which may not form 3-dimensional reaction products with the metal and/or which may not form, after a reaction with the metal, 3-dimensional reaction products that undergo creep corrosion. The chemical compound 332 may be used additionally or exclusively.

In various embodiments, at least one of the first functional group 332F1 and the second functional group 332F2 may include at least one functional group of a group of functional groups including silicon amine, silicon diamine, silicon triamine, silicon diethylenetriamine tetraacetate, TAAcOH, 3-(2-dimethylaminoethyl)indole, amino group, derivative of an amino group, substituted amino group, derivative of a substituted amino group, cyanide, cyanide derivative, isocyanide, isocyanide derivative, cyanate, cyanate derivative, isocyanate, isocyanate derivative, aromatic or alkylic nitrogen-containing molecule, carboxylate, carboxylate derivative, epoxy group, derivative of phosphorous acid, and derivative of phosphoric acid.

In various embodiments, the other of the first functional group 332F1 and the second functional group 332F2 may include a siloxane or a substituted siloxane.

In various embodiments, the chemical compound 332 may include a bi-functional substituted steric hindered compound, a bi-functional aromatic compound or a bi-functional multiaromatic compound.

In various embodiments, the chemical compound 332 may be bonded to the chip metal surface 106m, and a bonding product of the chemical compound and the metal of the chip metal surface 106m may have a two-dimensional configuration.

In various embodiments, the packaging material 334 may be in a liquid state when it is arranged as part of the chip package. The packaging material 334 may for example be molten, or it may include a solvent. After the arranging the packaging material 334, the packaging material 334 may solidify, for example by cooling down or by evaporation of the solvent. The packaging material 334 may be arranged to at least partially, for example completely, encapsulate the chip 106. The packaging material 334 may further at least partially encapsulate the metal contact structure 110. For example a contact region 218, in which the metal contact structure 110 may form an electrically conductive contact with the chip 106, e.g. with the chip metal surface 106m, may be encapsulated by the packaging material 334. An external contacting portion 110e of the metal contact structure 110 may remain free from the packaging material 334 for electrically contacting the chip 106 from an outside of the chip package.

In various embodiments, for example in a case as shown in FIG. 3A, of the metal contact structure 110 including a plurality of individual parts, e.g. a wire 110a and a leadframe 110b, a contact region 220 between the individual parts, e.g. between the wire 110a and the leadframe 110b, may also be encapsulated by the packaging material 334.

In various embodiments, the chip package may include a plurality of interface regions between a metal surface and the packaging material 334, for example between the chip metal surface 106m (shown in FIG. 3A is a front side chip metal surface; however, in a case of a chip back side opposite the chip front side or a chip side surface also being at least partially encapsulated by the packaging material 334 and including metal, the same may also apply to these surfaces) and the packaging material 334, between the metal contact structure 110, e.g. disturbed portions 330a and/or 330b, a wire, a lead frame, or any other variety of metal contact structure 110 as described above, and the packaging material 334, and/or between any other metal structure at least partially embedded in the packaging material 224 and the packaging material 334. Herein, the metal surface may include or consist of any metal that is suitable for forming a metal surface included in a chip package, including noble metals.

In various embodiments, as shown in FIG. 3A, at least a portion of the chemical compound 332 may bond to at least one of the metal surfaces forming an interface with the packaging material 334. At least a portion of the plurality of molecules of the chemical compound 332 may bond to at least one of the metal surfaces forming an interface with the packaging material 334, for example to the chip metal surface 106m and/or to the metal contact structure, for example to the wire 110a and/or the lead frame 110b of the metal contact structure, for example the disturbed regions 330a and/or 330b.

In various embodiments, the chemical compound 332 may protect the metal surfaces to which it is bonded from getting in contact with corrosive elements, e.g. sulfur, selenium, tellurium, or oxygen, that may be included in the packaging material 334. A number and/or density of the chemical compound 332 may be sufficient for a layer of the chemical compound 332 to form on the metal surface.

In various embodiments, even for metal surfaces that may still be in direct contact with the packaging material 334 and the corrosive elements that may be included therein, a corrosion activity may be reduced, because catalytic reactions and creep corrosion may be reduced.

In various embodiments, the molecules of the chemical compound 332 may bond to the at least one metal surface with their respective first functional group 332F1.

In an exemplary embodiment shown in FIG. 3B, an aromatic chemical compound 332 with a first functional group 332F1 of an amino type may bond to copper atoms, which may be included in, e.g., the disturbed regions 330a, 330b, the chip metal surface 106m, the second portion 110b (e.g. the leadframe) of the metal contact structure 110, a metal layer 110bm arranged thereon, the noble metal coating 110a3 of the first portion 110a of the metal contact structure 110, or any other metal surface in the chip package that is in direct contact with the packaging material 334. The bond may be established between the first functional group 332F1 (here: the amino type group including nitrogen) of the chemical compound 332 and the copper of the metal surface. The bond between the first functional group 332F1 and the metal M may in this example be formed as —N-M.

In various embodiments, individual molecules of the chemical compound 332 bonded to the metal surface may form bonds with each other (marked with 336). Such bonding may further improve a stability of the chemical compound 332 bonded to the metal surface, for example a stability of a layer formed by the chemical compound 332 on the metal surface. Furthermore, the layer of the chemical compound 332 may be less likely to be penetrated towards the metal surface by various atoms or molecules, e.g. the corrosive elements.

In various embodiments, even in a case of the organic root 332R and/or a potential second functional group 332F2 not forming chemical bonds with the packaging material 334, the chemical compound 332 bound to the metal may form a surface having a higher adhesion towards the packaging material 334 than the metal surface.

In variations to the exemplary embodiment of FIG. 3A, the metal surface may include or consist of any metal other than copper that may be included in the chip package and form an interface with the packaging material, and/or the chemical compound 332 may include or consist of any other suitable chemical component, e.g. one or more of the chemical components described above, for example a chemical component 332 with a second functional group 332F2 that may bond to the packaging material 334.

In various embodiments, the chemical compound 332 may determine how the chemical compound 332 may be arranged with respect to the metal surface. In the exemplary embodiment of FIG. 3A, the amino-type organic root 332R may project to a far side of the metal surface. In a case of the chemical compound 332 including two or more functional groups, the first functional group 332F1 may have a higher affinity towards the metal of the metal surface(s), such that the first functional group 332F1 may bond with the metal, and the organic root 332R and the second functional group 332F2 (and other potential functional groups) may be arranged further away from the metal surface than the first functional group 332F1. The organic root 332R and/or the second functional group 332F2 may form bonds with the packaging material 334 and/or with each other. Thereby, an adhesion between the (chemical compound-coated) metal surface and the packaging material 334 may be improved.

Phrasing it differently, one of the functional groups—by convention referred to as the first functional group 332F1 here—may coordinate with, e.g. bond to, the metal surface, because of e.g. differences in bonding strengths between the first functional group 332F1 and the second functional group 332F2 (or further functional groups) with metal, or for steric reasons. Therefore, the second functional group 332F2 may be available to coordinate with, e.g. bond to, functional groups of the packaging material 334, e.g. the molding compound, and thus excellent adhesion may be provided between the metal of the metal surface and the packaging material 334, which may for example be a polymer material.

According to the various embodiments, the chemical compound 332 may be physically contacting the packaging material 334 and at least one of the chip metal surface 106m (or 106p, in a case of the cap layer 106p being formed) and the metal contact structure 110, wherein the chemical compound 332 may be configured to improve an adhesion between the metal contact structure 110 and the packaging material 334 and/or between the chip metal surface 106m (in a case of the cap layer 106p being formed on the chip metal surface 106m, this may also be or include the cap layer 106p) and the packaging material 334, as compared with an adhesion in an arrangement without the chemical compound 332.

In various embodiments, a bonding of the chemical compound 332 to the metal surface may occur while the packaging material 334 is in the liquid state. In other words, the plurality of molecules of the chemical compound 332 may move towards the metal surface and be bonded to the metal surface with their first functional group 332F1 while the packaging material 334 is liquid. The chemical compound 332 may remain at their position when the packaging material 334 is solidified.

In various embodiments, the chemical compound 332 may already be pre-attached to another component of the packaging material 334, for example to the molding compound, e.g. a polymer resin, a coloring material, or the like, by the second functional group 332F2 (or any further functional group). The first functional group 332F1 may remain free for bonding to the metal of the metal surface.

The chemical compound 332 may, in various embodiments, be an addition to components currently in use in packaging materials, or a partial or full replacement for such components.

The packaging material 334 including the chemical compound 332 may be applied as part of a standard back end process flow. The process flow may further include for example pre-cleaning and/or surface roughening processes, which may for example include plasma treatment or wet treatment.

Figure 4A:
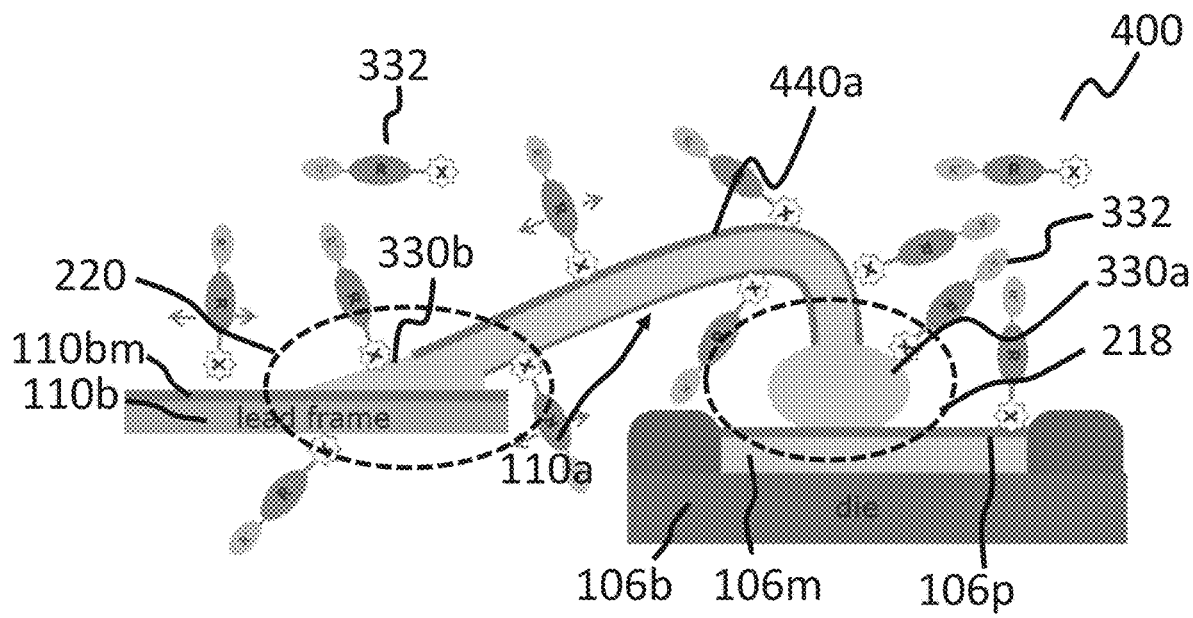
FIG. 4A shows a schematic cross section of a chip package according to various embodiments.

FIG. 4A shows a schematic cross section 400 of a chip package according to various embodiments.

Parts, processes, etc. of the chip package of FIG. 4A may be similar or identical to those described above in context with FIG. 3A, and their description is not repeated here.

A forming of the chip package of FIG. 4A may differ from that of FIG. 3A in that the chemical compound may not, or at least not exclusively, be arranged on the metal surface together with the chemical compound.

Instead, in accordance with various embodiments, the chemical compound 332 may be arranged on the metal surface, which may include or consist of all the metal surfaces on which the chemical compound 332 may be arranged according to the various embodiments of FIG. 3A, e.g. the chip metal surface 106m or the metal contact structure 110, before the packaging material is arranged (not shown in FIG. 4A).

The arranging the chemical compound 332 on the metal surface may include any suitable process for arranging the chemical compound 332 on the metal surface, for example depositing, e.g. by spraying or by arranging a liquid including the chemical compound in contact with the metal surface, thus allowing the chemical compound to move towards the metal surface and bond there. The chemical compound 332 may be arranged only on the metal surface, only on some of the metal surfaces in the chip package, and/or on other surfaces of the package, for example a substrate surface, e.g. a semiconductor substrate surface.

In various embodiments, the chemical compound 332 may be arranged after the electrical contacting the chip 110 with the metal contact structure 110.

Figure 4B:
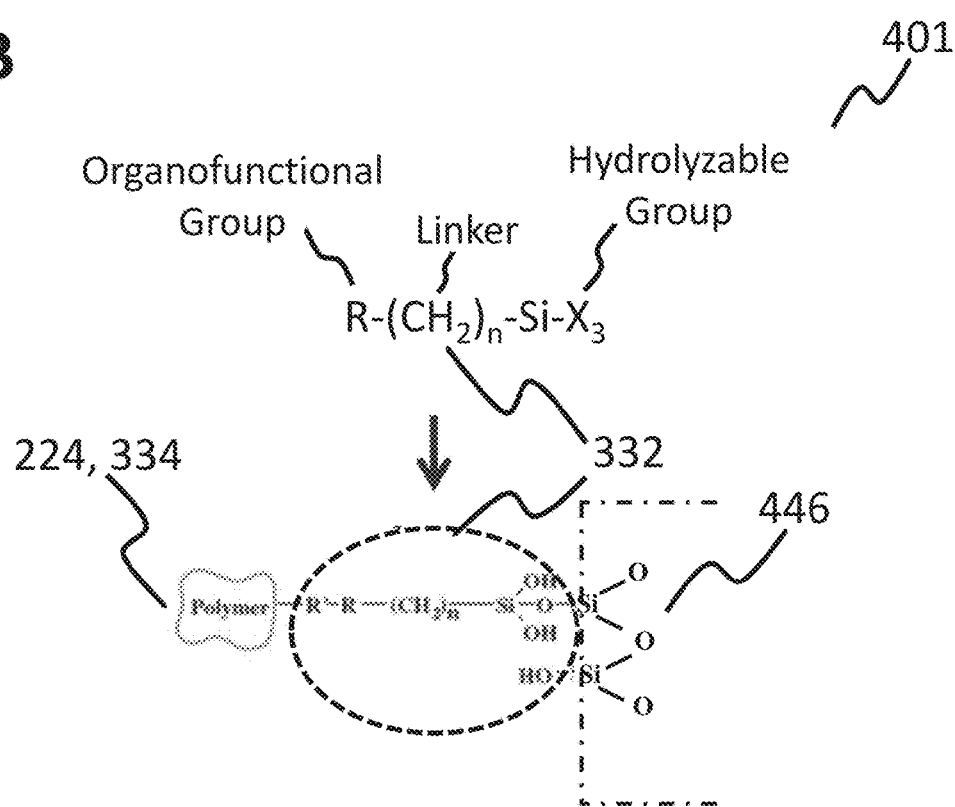
FIG. 4B shows schematically chemical reactions and bonds between molecules of a chemical compound and a substrate surface according to various embodiments.

FIG. 4B shows in view 401 schematically chemical reactions and bonds between molecules of an exemplary chemical compound 332 and a substrate surface according to various embodiments.

The chemical compound 332 may, in various embodiments, in addition to increasing an adhesion between the metal surface and the packaging material 224, 334 also increase an adhesion between another material included in the package, e.g. a substrate 446, e.g. a semiconductor substrate, e.g. a silicon substrate, and the packaging material 224, 334. This is shown in a bottom panel of FIG. 4B, where the chemical compound 332 bonds to both, the substrate 446 and the packaging material (e.g. a polymer) 224, 334.

The packaging material to be arranged after the arranging of the chemical compound 332 on the metal surface may be the conventional packaging material 224 as described in context with FIG. 2. An advantage of arranging the chemical compound 332 on the metal surface before arranging the packaging material may be a flexibility to use the conventional packaging material 224, which may not need to include the chemical compound 332. However, the packaging material 334 in accordance with various embodiments may also be used.

In various embodiments, the processes of the method of forming a chip package may be integrated into a standard backend process flow, including, e.g., pre-cleaning and/or surface roughening processes.

FIG. 5 shows a process flow 500 for a method of forming a chip package according to various embodiments.

In various embodiments, a method of forming a chip package is provided. The method may include electrically contacting a metal contact structure to a chip metal surface of a chip (in 510), arranging a chemical compound in physical contact with at least one of the metal contact structure and the chip metal surface, wherein the chemical compound may be configured to improve an adhesion between the metal contact structure and a packaging material and/or between the chip metal surface and the packaging material, as compared with an adhesion in an arrangement without the chemical compound, and wherein the chemical compound may be essentially free from functional groups including sulfur, selenium or tellurium (in 520), and at least partially encapsulating the chip and the metal contact structure with packaging material, wherein the packaging material may be in physical contact with the chemical compound (in 530).

In various embodiments, as described in context with FIG. 3A, FIG. 3B and FIG. 4A, the disposing the chemical compound may be executed after the electrically contacting the metal surface of the chip and before the at least partially encapsulating the chip and the metal contact structure. The at least partially encapsulating may include arranging the packaging material in physical contact with the chemical compound.

In various embodiments, the chemical compound may be distributed in the packaging material, and the arranging the chemical compound may be executed together with the at least partially encapsulating the chip and the metal contact structure, for example as described in context with FIG. 3A and FIG. 3B.

In various embodiments, the chemical compound may, before the arranging of the packaging material together with the chemical compound, have a first functional group that may be free for bonding to the metal, and may have a second functional group that is bonded to another component of the packaging material (the molding compound), for example a polymer resin, a filler material, a coloring material, a catalyst, a flexibilizer, a wax, an adhesion promoter, or a stabilizer, e.g. a UV stabilizer, an oxidation stabilizer, or a temperature decomposition stabilizer or any other common packaging material component.

In various embodiments, the arranging the chemical compound may be executed before the arranging of the packaging material, for example as described in context with FIG. 4A.

In various embodiments, the arranging of the chemical compound may include depositing the chemical compound.

In various embodiments, the arranging of the chemical compound in physical contact with at least one of the metal contact structure and the chip metal surface as described in 520 of FIG. 5 may include introducing a pre-chemical compound to form the chemical compound for creating the adhesive bond between different types of materials, e.g. between organic and inorganic materials. The chemical compound, in its final form in the chip package, may include the first functional group and the second functional group for bonding between the packaging material and the metal surface and/or to the metal contact structure. At least one of the first functional group and/or the second functional group may include silicon, nitrogen and carbon atoms arranged between the silicon and the nitrogen. These functional groups may include, for example, a chemical compound selected from a group consisting of: a substituted siloxane, tetracyanoquinodimethane, tetracyanoethylene, Si-amine, Si-diamine, Si-triamine, Si-diethylentnamintetraacetat, Si-3-[2(dimethylamino)ethyl]indol aminopropyloxirane, a cyanate, a cyanate derivative, dicyclopentadiene, adamantane, urotropine, cyclodextrine, cryptandene, or any combinations thereof. Accordingly, the pre-chemical compound may be selectively chosen to be introduced into the chip package so that a modification to the pre-chemical compound, e.g. via removal of a group such as an alkoxy or the like, results in the formation of the chemical compound.

For example, the pre-chemical compound may be any silane compound, or a similar compound, as provided herein. Such a compound may include an organofunctional group, a linker, and a hydrolyzable group as shown in FIG. 4B. The hydrolyzable group may be an alkoxy, acyloxy, halogen, amine, or the like.

In various embodiments, an exemplary compound 332 as shown in FIG. 4B may be provided. It is appreciated that for purposes of the ensuing exemplary explanation, an organosilane with one organofunctional group and three hydrolyzable groups is described, but it is appreciated that other compounds exhibiting similar characteristics to those described herein may be similarly provided.

After application of the pre-chemical compound to the chip package, the chip package may be subject to conditions to trigger hydrolysis of the hydrolyzable group. The hydrolysis may help form a reactive silanol group, which may condense with other similar groups to form siloxane linkages on a substrate surface as shown in FIG. 4B. Stable condensation products may be formed with other oxides other than silicon oxides, such as aluminum, zirconium, tin, titanium, nickel, etc. Similar, albeit potentially less stable, bonds may form with other types of oxides including boron, iron, carbon, etc. In FIG. 4B, the R group may be a non-hydrolyzable group that is selectively chosen so as to impart the desired characteristic in the chip package's final structure, e.g. to increase an adhesion between the metal contact structure and the packaging material and/or between the chip metal surface and the packaging material.

The hydrolyzable group(s) may be selected from groups such as alkoxies or aryloxies. The hydrolyzable groups are hydrolyzed under appropriate conditions to form a compound with a silanol group (or similar type of functional group with an —OH group where another pre-chemical compound not containing silicon is selected). This process may include a number of steps. First, hydrolysis of the hydrolyzable groups occurs. The water for the hydrolysis may be provided, it may be present on the substrate surface, or it may come from the atmosphere. The amount of water and the pre-chemical compound may determine the degree of polymerization, e.g. lower solubility pre-chemical compounds in water will likely favor a high degree of polymerization. A concentration of the pre-chemical compound solution may be selected to influence the thickness of the resulting chemical compound between the metal contact structure and the packaging material and/or between the chip metal surface and the packaging material. Additionally, multiple organic substitution may favor the formation of stable monomeric silanols, e.g. by including phenyl or tertiary butyl groups as the hydrolyzable groups.

This initial hydrolysis step is followed by condensation to oligomers. Then, the oligomers may from hydrogen bonds with —OH groups on the desired surface, e.g. the chip surface or the metal contact structure. The final step may include drying/heating to form a resulting covalent bond of the chemical compound with the desired surface due to the accompanying production of $H_2O$ molecules. These steps may occur sequentially or they may occur simultaneously after the initial hydrolysis of the hydrolyzable groups.

In various embodiments, the pre-chemical compound is a reactant selected from a group consisting of: a (3-Aminopropyl)triethoxysilane, a (3-Aminopropyl)trimethoxysilane, a 3-Aminopropylsilanetriol, a (3-Glycidoxypropyl)triethoxysilane, a (3-Glycidoxypropyl)triethoxysilane, a (3-Glycidoxypropyl)trimethoxysilane, a 3-(2-Aminoethylamino)propyl-dimethoxymethylsilane, or combinations thereof. The pre-chemical compound may be provided in water, isopropyl alcohol, ethanol, or the like.

Reaction conditions may include a time in the range of several or more hours, e.g. up to 15 hours, at elevated temperatures from about 40° C. to about 150° C. In various embodiments, depending on the pre-chemical compound that is selected or the chemical compound formed between the metal contact structure and the packaging material and/or between the chip metal surface and the packaging material, catalysts may be used to facilitate the formation of the chemical compound.

In various embodiments, a chip package is provided. The chip package may include a chip including a chip metal surface, a metal contact structure electrically contacting the chip metal surface, a packaging material at least partially encapsulating the chip and the metal contact structure, and a chemical compound physically contacting the packaging material and at least one of the chip metal surface and the metal contact structure, wherein the chemical compound may be configured to improve an adhesion between the metal contact structure and the packaging material and/or between the chip metal surface and the packaging material, as compared with an adhesion in an arrangement without the chemical compound, wherein the chemical compound is essentially free from functional groups including sulfur, selenium or tellurium.

In various embodiments, the chemical compound may include a first functional group bonded to the metal surface, and a second functional group bonded to the packaging material.

In various embodiments, at least one of the first functional group and the second functional group may include at least one functional group of a group of functional groups including silicon amine, silicon diamine, silicon triamine, silicon diethylenetriamine tetraacetate, TAAcOH, 3-(2-dimethylaminoethyl)indole, amino group, derivative of an amino group, substituted amino group, derivative of a substituted amino group, cyanide, cyanide derivative, isocyanide, isocyanide derivative, cyanate, cyanate derivative, isocyanate, isocyanate derivative, aromatic or alkylic nitrogen-containing molecule, carboxylate, carboxylate derivative, epoxy group, derivative of phosphorous acid, and derivative of phosphoric acid.

In various embodiments, the other of the first functional group and the second functional group may include a siloxane or a substituted siloxane.

In various embodiments, the chemical compound may include a bi-functional substituted steric hindered compound.

In various embodiments, the chemical compound may include a bi-functional aromatic compound or a bi-functional multiaromatic compound.

In various embodiments, the chemical compound may be bonded to the chip metal surface, and a bonding product of the chemical compound and the metal of the chip metal surface may have a two-dimensional configuration.

In various embodiments, the chip metal surface and/or the metal contact structure may include a noble metal.

In various embodiments, a method of forming a chip package is provided. The method may include electrically contacting a metal contact structure to a chip metal surface of a chip, arranging a chemical compound in physical contact with at least one of the metal contact structure and the chip metal surface, wherein the chemical compound may be configured to improve an adhesion between the metal contact structure and a packaging material and/or between the chip metal surface and the packaging material, as compared with an adhesion in an arrangement without the chemical compound, and wherein the chemical compound may be essentially free from functional groups including sulfur, selenium or tellurium, and at least partially encapsulating the chip and the metal contact structure with packaging material, wherein the packaging material may be in physical contact with the chemical compound.

In various embodiments, the disposing the chemical compound may be executed after the electrically contacting the metal surface of the chip and before the at least partially encapsulating the chip and the metal contact structure.

In various embodiments, the chemical compound may be distributed in the packaging material, and the arranging the chemical compound may be executed together with the at least partially encapsulating the chip and the metal contact structure.

In various embodiments, the chemical compound may, before the arranging of the packaging material together with the chemical compound, have a first functional group that may be free for bonding to the metal, and may have a second functional group that is bonded to another component of the packaging material (the molding compound), for example a polymer resin, a filler material, a coloring material, or any other common packaging material component.

In various embodiments, the arranging the chemical compound may be executed before the arranging of the packaging material.

In various embodiments, the arranging the chemical compound may include depositing the chemical compound.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A method of forming a chip package, the method comprising:
    providing a chip comprising a chip metal surface;
    electrically contacting a metal contact structure with the chip metal surface;
    arranging a chemical compound in physical contact with at least one of the chip metal surface and the metal contact structure; and
    at least partially encapsulating the chip and the metal contact structure with packaging material, the packaging material in physical contact with the chemical compound;
    wherein the chemical compound is configured to increase an adhesion between the metal contact structure and the packaging material and/or between the chip metal surface and the packaging material, as compared with an adhesion in an arrangement without the chemical compound;
    wherein the chemical compound is essentially free from functional groups comprising sulfur, selenium, or tellurium;
    wherein the chemical compound comprises a first functional group bonded to the chip metal surface and/or to the metal contact structure, and a second functional group bonded to the packaging material; and
    wherein at least one of the first functional group and/or the second functional group comprises the chemical compound selected from a group consisting of: a substituted siloxane, tetracyanoquinodimethane, tetracyanoethylene, Si-amine, Si-diamine, Si-triamine, Si-diethylentnamintetraacetat, Si-3-[2(dimethylamino)ethyl]indold aminopropyloxirane, or a combination thereof.

2. The method of claim 1,
    wherein the arranging the chemical compound in physical contact with the at least one of the chip metal surface and the metal contact structure comprises:
        arranging a pre-chemical compound in physical contact with the at least one of the chip metal surface and the metal contact structure and removing an alkoxy group of the pre-chemical compound to form the chemical compound.

3. The method of claim 2,
    wherein the pre-chemical compound is a reactant selected from a group consisting of: a (3-Aminopropyl)triethoxysilane, a (3-Aminopropyl)trimethoxysilane, a 3-Aminopropylsilanetriol, a (3-Glycidoxypropyl)triethoxysilane, a (3-Glycidoxypropyl)triethoxysilane, a (3-Glycidoxypropyl)trimethoxysilane, a 3-(2-Aminoethylamino)propyl-dimethoxymethylsilane, or a combination thereof.

4. The method of claim 1,
    wherein the arranging the chemical compound is performed after the electrically contacting the metal contact structure with the chip metal surface and before the at least partially encapsulating the chip and the metal contact structure.

5. The method of claim 1,
    wherein the chemical compound comprises a bi-functional aromatic compound or a bi-functional multiaromatic compound.

6. The method of claim 1,
    wherein the chemical compound is bonded to the chip metal surface, and
    wherein a bonding product of the chemical compound and the metal of the chip metal surface has a two-dimensional configuration.

7. The method of claim 1,
    wherein the chip metal surface and/or the metal contact structure comprises a noble metal.

8. A method of forming a chip package, comprising:
    providing a chip comprising a chip metal surface;
    electrically contacting a metal contact structure with the chip metal surface;
    distributing a chemical compound in a packaging material;
    at least partially encapsulating the chip and the metal contact structure with the packaging material, the chemical compound in the packaging material physically contacting at least one of the chip metal surface and the metal contact structure;
    wherein the chemical compound is configured to increase an adhesion of the packaging material to the metal contact structure and/or to the chip metal surface, as compared with an adhesion in an arrangement without the chemical compound, wherein the chemical compound is essentially free from functional groups comprising sulfur, selenium, or tellurium,
    wherein the chemical compound comprises a first functional group bonded to the chip metal surface and/or to the metal contact structure, and a second functional group bonded to the packaging material, and
    wherein at least one of the first functional group and/or the second functional group comprises a functional group chemical compound selected from a group consisting of: a substituted siloxane, tetracyanoquinodimethane, tetracyanoethylene, Si-amine, Si-diamine, Si-triamine, S diethylentnamintetraacetat, Si-3-[2(dimethylamino)ethyl]indold, and/or aminopropyloxirane.

9. The method of claim 8,
    wherein the distributing the chemical compound in the packaging material comprises:
        distributing a pre-chemical compound in the packaging material and removing an alkoxy group of the pre-chemical compound to form the chemical compound.

10. The method of claim 9,
    wherein the pre-chemical compound is selected from a group consisting of: a (3-Aminopropyl)triethoxysilane, a (3-Aminopropyl)trimethoxysilane, a 3-Aminopropylsilanetriol, a (3-Glycidoxypropyl)triethoxysilane, a (3-Glycidoxypropyl)triethoxysilane, a (3-Glycidoxypropyl)trimethoxysilane, a 3-(2-Aminoethylamino)propyl-dimethoxymethylsilane, or a combination thereof.

11. The method of claim 8,
    wherein the chemical compound comprises a bi-functional aromatic compound or a bi-functional multiaromatic compound.

12. The method of claim 8,
    wherein the chemical compound is bonded to the chip metal surface, and
    wherein a bonding product of the chemical compound and the metal of the chip metal surface has a two-dimensional configuration.

13. The method of claim 8,
    wherein the chip metal surface and/or the metal contact structure comprises a noble metal.

14. A method of forming a chip package, the method comprising:
- providing a chip comprising a chip metal surface;
- electrically contacting a metal contact structure with the chip metal surface;
- arranging a pre-chemical compound in physical contact with at least one of the chip metal surface and the metal contact structure, the pre-chemical compound forming, as a product, a chemical compound; and
- at least partially encapsulating the chip and the metal contact structure with packaging material, the packaging material in physical contact with the chemical compound;
- wherein the chemical compound is configured to increase an adhesion between the metal contact structure and the packaging material and/or between the chip metal surface and the packaging material, as compared with an adhesion in an arrangement without the chemical compound;
- wherein the chemical compound is essentially free from functional groups comprising sulfur, selenium, or tellurium;
- wherein the chemical compound comprises a first functional group bonded to the chip metal surface and/or to the metal contact structure, and a second functional group bonded to the packaging material; and
- wherein at least one of the first functional group and/or the second functional group comprises the pre-chemical compound that forms the chemical compound, the pre-chemical compound selected from a group consisting of: a (3-Aminopropyl)triethoxysilane, a (3-Aminopropyl)trimethoxysilane, a 3-Aminopropylsilanetriol, a (3-Glycidoxypropyl)triethoxysilane, a (3-Glycidoxypropyl)triethoxysilane, a (3-Glycidoxypropyl)trimethoxysilane, a 3-(2-Aminoethylamino)propyl-dimethoxymethylsilane, or a combination thereof.

15. The method of claim 14,
wherein the chemical compound is selected from a group consisting of: a substituted siloxane, tetracyanoquinodimethane, tetracyanoethylene, Si-amine, Si-diamine, Si-triamine, Si-diethylentnamintetraacetat, Si-3-[2(dimethylamino)ethyl]indold aminopropyloxirane, or a combination thereof.

16. The method of claim 14, further comprising:
removing an alkoxy group of the pre-chemical compound to form the chemical compound.

17. The method of claim 14,
wherein the arranging the chemical compound is performed after the electrically contacting the metal contact structure with the chip metal surface and before the at least partially encapsulating the chip and the metal contact structure.

18. The method of claim 14, further comprising:
distributing the chemical compound in the packaging material, and wherein the arranging the chemical compound is performed together with the at least partially encapsulating the chip and the metal contact structure.

19. The method of claim 14,
wherein the chemical compound comprises a bi-functional aromatic compound or a bi-functional multiaromatic compound.

20. The method of claim 14,
wherein the chemical compound is bonded to the chip metal surface, and
wherein a bonding product of the chemical compound and the metal of the chip metal surface has a two-dimensional configuration.

* * * * *

UNITED STATES PATENT AND TRADEMARK OFFICE
CERTIFICATE OF CORRECTION

PATENT NO. : 10,672,678 B2
APPLICATION NO. : 16/431808
DATED : June 2, 2020
INVENTOR(S) : Heinrich Koerner Page 1 of 1

It is certified that error appears in the above-identified patent and that said Letters Patent is hereby corrected as shown below:

In the Claims

Column 22, Line 37, Claim 8, change 'S diethylentnaminetraacetat' to
-- Si-diethylentnaminetraacetat --.

Signed and Sealed this
Twenty-ninth Day of September, 2020

Andrei Iancu
*Director of the United States Patent and Trademark Office*